United States Patent
Byers et al.

(10) Patent No.: US 10,565,322 B2
(45) Date of Patent: Feb. 18, 2020

(54) SYSTEMS AND METHODS FOR MANAGING ATTRIBUTES OF COMPUTER-AIDED DESIGN MODELS

(71) Applicant: General Electric Company, Schenectady, NY (US)

(72) Inventors: Jason Anton Byers, Greenville, SC (US); Brian Christopher Wheeler, Simpsonville, SC (US); Jeffrey David Erno, Simpsonville, SC (US)

(73) Assignee: General Electric Company, Schenectady, NY (US)

( * ) Notice: Subject to any disclaimer, the term of this patent is extended or adjusted under 35 U.S.C. 154(b) by 299 days.

(21) Appl. No.: 15/495,523

(22) Filed: Apr. 24, 2017

(65) Prior Publication Data
US 2018/0307781 A1    Oct. 25, 2018

(51) Int. Cl.
*G06F 17/50* (2006.01)
*G06Q 10/08* (2012.01)

(52) U.S. Cl.
CPC ........ *G06F 17/50* (2013.01); *G06Q 10/0875* (2013.01)

(58) Field of Classification Search
CPC .............................. G06F 17/50; G06Q 10/0875
USPC ........ 703/2, 22; 345/419; 707/119, 705, 717
See application file for complete search history.

(56) References Cited

U.S. PATENT DOCUMENTS

| | | | |
|---|---|---|---|
| 5,649,076 A * | 7/1997 | Nishizaka | G06T 17/10 345/419 |
| 7,698,323 B1 | 4/2010 | Rangan et al. | |
| 9,292,261 B1 * | 3/2016 | Bouldin | G06Q 10/00 |
| 9,886,230 B2 * | 2/2018 | Thimbleby | G06F 3/1454 |
| 2005/0203718 A1 | 9/2005 | Carek et al. | |
| 2006/0069926 A1 * | 3/2006 | Ginter | G06F 21/10 713/194 |
| 2007/0061154 A1 | 3/2007 | Markvoort et al. | |
| 2007/0180425 A1 * | 8/2007 | Storms | G06F 17/5004 717/104 |
| 2011/0022520 A1 * | 1/2011 | Ginter | G06F 21/10 705/51 |
| 2012/0110595 A1 | 5/2012 | Reitman et al. | |
| 2016/0098033 A1 * | 4/2016 | Singh | G05B 19/4097 700/98 |
| 2016/0357496 A1 * | 12/2016 | Thimbleby | G06F 3/1454 |
| 2017/0286318 A1 * | 10/2017 | Brannock | G06F 12/145 |

FOREIGN PATENT DOCUMENTS

DE       102013004922       9/2014

* cited by examiner

*Primary Examiner* — Thai Q Phan
(74) *Attorney, Agent, or Firm* — Fletcher Yoder, P.C.

(57) ABSTRACT

A system includes a processor configured to receive a modification to a first set of data associated with a first set of properties of a computer-aided design (CAD) model and identify a second set of data associated with a second set of properties of the CAD model based on the first set of data. The first and second sets of properties are related. The processor is also configured to modify the second set of data based on the modification to the first set of data.

20 Claims, 8 Drawing Sheets

SYSTEMS AND METHODS FOR MANAGING ATTRIBUTES OF COMPUTER-AIDED DESIGN MODELS

BACKGROUND

The subject matter disclosed herein relates to systems and methods for managing attributes of computer aided-design models, which may be used in the design and inspection of parts, such as industrial machine parts.

Industrial machines, such as gas turbine systems, may provide for the generation of power. For example, the gas turbine systems typically include a compressor for compressing a working fluid, such as air, a combustor for combusting the compressed working fluid with fuel, and a turbine for turning the combusted fluid into a rotative power. For example, the compressed air is injected into a combustor, which heats the fluid causing it to expand, and the expanded fluid is forced through the gas turbine. The gas turbine may then convert the expanded fluid into rotative power, for example, by a series of blade stages. The rotative power may then be used to drive a load, which may include an electrical generator producing electrical power and electrically coupled to a power distribution grid. Industrial machines and machine parts may be designed for a particular purpose, such as a compressor blade designed to compress air. The machine or part may undergo inspection for its ability to fulfill its design purpose.

BRIEF DESCRIPTION

Certain embodiments commensurate in scope with the original claims are summarized below. These embodiments are not intended to limit the scope of the claims, but rather these embodiments are intended only to provide a brief summary of possible forms of the embodiments described herein. Indeed, the embodiments described herein may encompass a variety of forms that may be similar to or different from the embodiments set forth below.

In a first embodiment, a system includes a processor configured to receive a modification to a first set of data associated with a first set of properties of a computer-aided design (CAD) model and identify a second set of data associated with a second set of properties of the CAD model based on the first set of data. The first and second sets of properties are related. The processor is also configured to modify the second set of data based on the modification to the first set of data.

In another embodiment, a tangible, non-transitory, machine-readable medium includes instructions configured to cause a processor to receive a modification to a first set of data associated with a first set of properties of a computer-aided design (CAD) model and identify a second set of data associated with a second set of properties of the CAD model based on the first set of data. The first and second sets of properties are related. Additionally, instructions are also configured to cause the processor to modify the second set of data based on the modification to the first set of data.

In yet another embodiment, a method includes receiving, via a processor, a modification to a first set of data associated with a first set of properties of a first computer-aided design (CAD) model and identifying, via the processor, a second set of data associated with a second set of properties of the first CAD model or a third set of data associated with a third set of properties of a second CAD model based on the first set of data. The first set of data is related to the second and third sets of data. The method also includes modifying, via the processor, the second set of data or third set of data based on the modification to the first set of data.

BRIEF DESCRIPTION OF THE DRAWINGS

These and other features, aspects, and advantages of the present application will become better understood when the following detailed description is read with reference to the accompanying drawings in which like characters represent like parts throughout the drawings, wherein.

DETAILED DESCRIPTION

One or more specific embodiments of the present disclosure will be described below. In an effort to provide a concise description of these embodiments, all features of an actual implementation may not be described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of the present disclosure, the articles "a," "an," "the," and "said" are intended to mean that there are one or more of the elements. The terms "comprising," "including," and "having" are intended to be inclusive and mean that there may be additional elements other than the listed elements.

Designing a machine or part may include certain systems and methods described in more detail below that produce a part design. For example, the part design may be created as a model-based definition included in a three-dimensional (3D) computer-aided design (CAD) model. A user may modify a feature of the model. The attribute managing application may allow for modifications made to a feature of a model to be implemented on other features (e.g., duplicates of the feature). The attribute managing application may also generate a callout of the components of a model. The callout, which may also be referred to as a callout list, is a list that includes features of a model. The callout may also include various information such as a part or component name or number, a callout number, the number of a part or component present in the model. By allowing for modifications applied on one aspect of a model to be executed on other aspects of the model, the part model may be generated and modified more efficiently and accurately.

Figure 1:
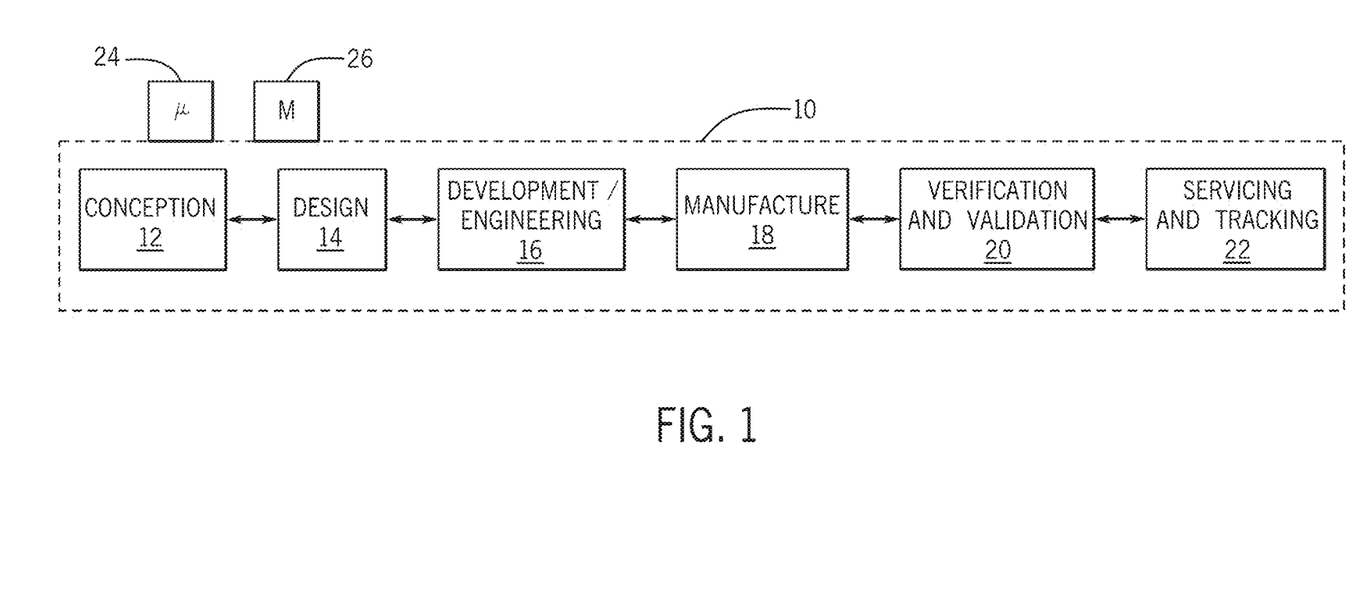
FIG. 1 is a block diagram of an embodiment of a computer-aided technology (CAx) system, in accordance with embodiments described herein.

With the foregoing in mind, it may be useful to describe a computer-aided technologies (CAx) system that may incorporate the techniques described herein, for example to improve the design, review, and modification of models. Accordingly, FIG. 1 illustrates an embodiment of a CAx system 10 suitable for providing for a variety of processes, including product lifecycle management (PLM) processes 12, 14, 16, 18, 20, 22. In the depicted embodiment, the CAx system 10 may include support for execution of conception processes 12. For example, the conception processes 12 may produce a set of specifications such as requirements specifications documenting a set of requirements to be satisfied by a design, a part, a product, or a combination thereof. The conception processes 12 may also produce a concept or prototype for the part or product (e.g., machine). A series of design processes 14 may then use the specifications and/or prototype to produce, for example, one or more 3D design models of the part or product. The 3D design models may include solid/surface modeling, parametric models, wireframe models, vector models, non-uniform rational basis spline (NURBS) models, geometric models, 2-dimensional models (2D) manufacturing part and assembly drawings, and the like.

Design models may then be further refined and added to via the execution of development/engineering processes 16. The development/engineering processes may, for example, create and apply models such as thermodynamic models, low cycle fatigue (LCF) life prediction models, multibody dynamics and kinematics models, computational fluid dynamics (CFD) models, finite element analysis (FEA) models, and/or 3-dimension to 2-dimension FEA mapping models that may be used to predict the behavior of the part or product during its operation. For example, turbine blades may be modeled to predict fluid flows, pressures, clearances, and the like, during operations of a gas turbine engine. The development/engineering processes 16 may additionally result in tolerances, materials specifications (e.g., material type, material hardness), clearance specifications, and the like.

The CAx system 10 may additionally provide for manufacturing processes 18 that may include manufacturing automation support. For example, additive manufacturing models may be derived, such as 3D printing models for material jetting, binder jetting, vat photopolymerization, powder bed fusion, sheet lamination, directed energy deposition, material extrusion, and the like, to create the part or product. Other manufacturing models may be derived, such as computer numeric control (CNC) models with G-code to machine or otherwise remove material to produce the part or product (e.g., via milling, lathing, plasma cutting, wire cutting, and so on). Bill of materials (BOM) creation, requisition orders, purchasing orders, and the like, may also be provided as part of the manufacture processes 18 (or other PLM processes).

The CAx system 10 may additionally provide for verification and/or validation processes 20 that may include automated inspection of the part or product as well as automated comparison of specifications, requirements, and the like. In one example, a coordinate-measuring machine (CMM) process may be used to automate inspection of the part or product. After the part is inspected, results from the CMM process may be automatically generated via an electronic Characteristic Accountability & Verification (eCAV) system.

A servicing and tracking set of processes 22 may also be provided via the CAx system 10. The servicing and tracking processes 22 may log maintenance activities for the part, part replacements, part life (e.g., in fired hours), and so on. As illustrated, the CAx system 10 may include feedback between the processes 12, 14, 16, 18, 20, 22. For example, data from services and tracking processes 22, for example, may be used to redesign the part or product via the design processes 14. Indeed, data from any one of the processes 12, 14, 16, 18, 20, 22 may be used by any other of the processes 12, 14, 16, 18, 20, 22 to improve the part or product or to create a new part or a new product. In this manner, the CAx system 10 may incorporate data from downstream processes and use the data to improve the part or to create a new part.

The CAx system 10 may additionally include one or more processors 24 and a memory system 26 that may execute software programs to perform the disclosed techniques. Moreover, the processors 24 may include multiple microprocessors, one or more "general-purpose" microprocessors, one or more special-purpose microprocessors, and/or one or more application specific integrated circuits (ASICS), or some combination thereof. For example, the processors 24 may include one or more reduced instruction set (RISC) processors. The memory system 26 may store information such as control software, look up tables, configuration data, etc. The memory system 26 may include a tangible, non-transitory, machine-readable medium, such as a volatile memory (e.g., a random access memory (RAM)) and/or a nonvolatile memory (e.g., a read-only memory (ROM), flash memory, a hard drive, or any other suitable optical, magnetic, or solid-state storage medium, or a combination thereof).

Figure 2:
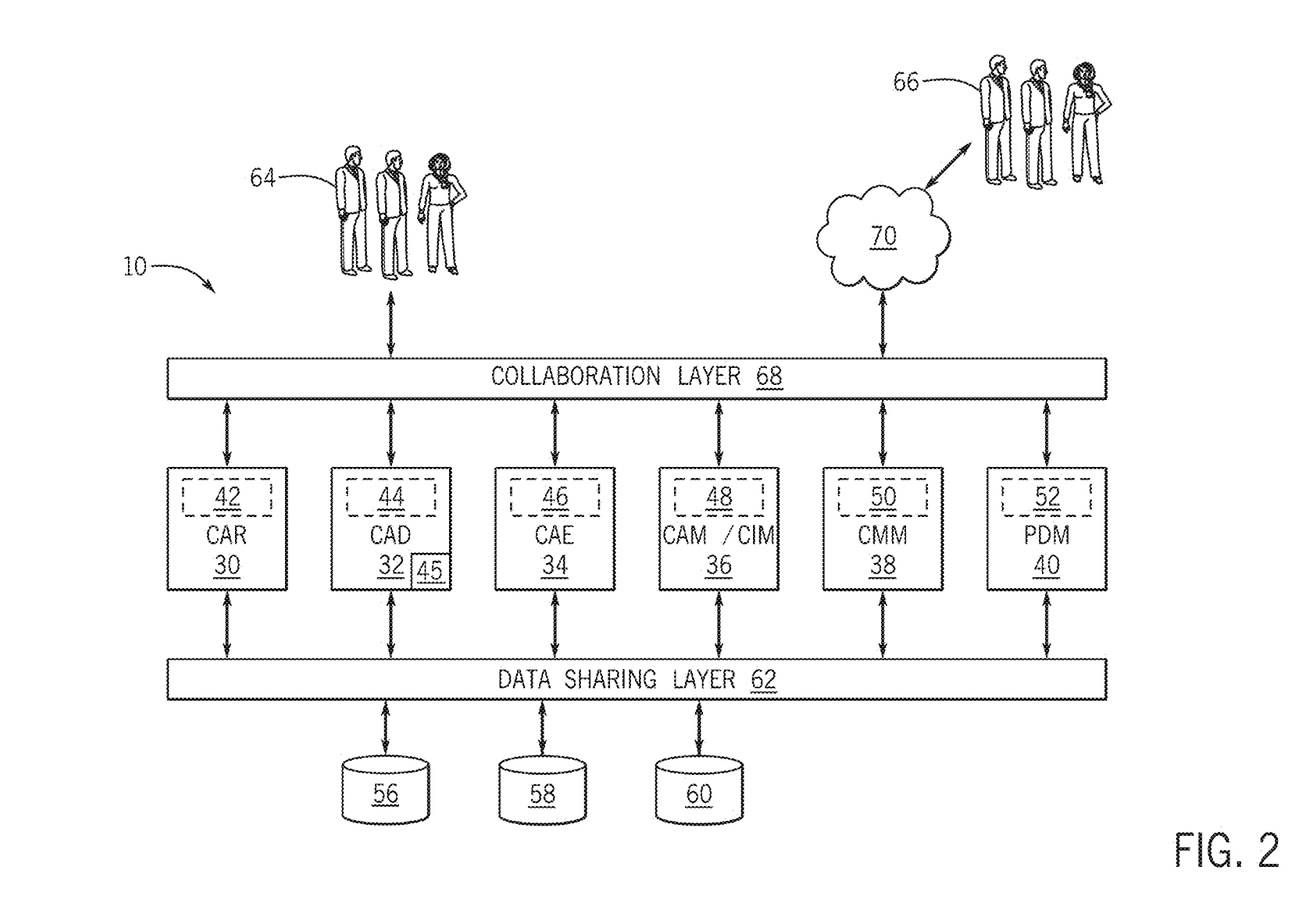
FIG. 2 is a block diagram of a certain components of the CAx system of FIG. 1, in accordance with embodiments described herein.

The memory system 26 may store a variety of information, which may be suitable for various purposes. For example, the memory system 26 may store machine-readable and/or processor-executable instructions (e.g., firmware or software) for the processors' 24 execution. In one embodiment, the executable instructions include instructions for a number of PLM systems, for example software systems, as shown in the embodiment of FIG. 2. More specifically, the CAx system 10 embodiment illustrates a computer-aided requirements capture (CAR) system 30, a computer-aided design (CAD) system 32, a computer-aided engineering (CAE) system 34, computer-aided manufacturing/computer-integrated manufacturing (CAM/CIM) system 36, a coordinate-measuring machine (CMM) system 38, and a product data management (PDM) system 40. Each of the systems 30, 32, 34, 36, 38 and 40 may be extensible and/or customizable; accordingly, each system 30 may include an extensibility and customization system 42, 44, 46, 48, 50, and 52, respectively. Additionally, each of the systems 30, 32, 34, 36, 38 and 40 may be stored in a memory system, such as memory system 26, and may be executable via a processor, such as via processors 24.

In the depicted embodiment, the CAR system 30 may provide for entry of requirements and/or specifications, such as dimensions for the part or product, operational conditions that the part or product is expected to encounter (e.g., temperatures, pressures), certifications to be adhered to, quality control requirements, performance requirements, and so on. The CAD system 32 may provide for a graphical user interface suitable to create and manipulate graphical representations of 2D and/or 3D models as described above with respect to the design processes 14. For example, the 3D design models may include solid/surface modeling, parametric models, wireframe models, vector models, non-uniform rational basis spline (NURBS) models, geometric models, and the like. The CAD system 32 may provide for the creation and updating of the 2D and/or 3D models and related information (e.g., views, drawings, annotations, notes, and so on). Indeed, the CAD system 32 may combine a graphical representation of the part or product with other, related information. The CAD system 32 may include an attribute managing application 45 that, when executed by the processors 24, may allow users to apply changes made to one aspect of a model to other aspects of the model. More specifically, and as described in detail below, the 2D and 3D models may include programming objects, the programming objects may include attributes, and the attribute managing application 45 may allow for a modification to an attribute or an addition or deletion of an attribute associated with a programming object to be applied to other programming objects. Additionally, the attribute managing application 45 may generate a callout of the parts and/or components of a model. The callout may also include various information such as a part or component name or number, a callout number, the number of a part or component present in the model.

The CAE system 34 may enable creation of various engineering models, such as the models described above with respect to the development/engineering processes 16. For example, the CAE system 34 may apply engineering principles to create models such as thermodynamic models, low cycle fatigue (LCF) life prediction models, multibody dynamics and kinematics models, computational fluid dynamics (CFD) models, finite element analysis (FEA) models, and/or 3-dimension to 2-dimension FEA mapping models. The CAE system 34 may then apply the aforementioned models to analyze certain part or product properties (e.g., physical properties, thermodynamic properties, fluid flow properties, and so on), for example, to better match the requirements and specifications for the part or product.

The CAM/CIM system 36 may provide for certain automation and manufacturing efficiencies, for example, by deriving certain programs or code (e.g., G-code) and then executing the programs or code to manufacture the part or product. The CAM/CIM system 36 may support certain automated manufacturing techniques, such as additive (or subtractive) manufacturing techniques, including material jetting, binder jetting, vat photopolymerization, powder bed fusion, sheet lamination, directed energy deposition, material extrusion, milling, lathing, plasma cutting, wire cutting, or a combination thereof. The CMM system 38 may include machinery to automate inspections. For example, probe-based, camera-based, and/or sensor-based machinery may automatically inspect the part or product to ensure compliance with certain geometries, tolerances, shapes, and so on.

The PDM system 40 may be responsible for the management and publication of data from the systems 30, 32, 34, 36, and/or 38. For example, the systems 30, 32, 34, 36, and/or 38 may communicate with data repositories 56, 58, 60 via a data sharing layer 62. The PDM system 40 may then manage collaboration between the systems 30, 32, 34, 36, and/or 38 by providing for data translation services, versioning support, archive management, notices of updates, and so on. The PDM system 40 may additionally provide for business support such as interfacing with supplier/vendor systems and/or logistics systems for purchasing, invoicing, order tracking, and so on. The PDM system 40 may also interface with service/logging systems (e.g., service center data management systems) to aid in tracking the maintenance and life cycle of the part or product as it undergoes operations. Teams 64, 66 may collaborate with team members via a collaboration layer 68. The collaboration layer 68 may include web interfaces, messaging systems, file drop/pickup systems, and the like, suitable for sharing information and a variety of data. The collaboration layer 68 may also include cloud-based systems 70 or communicate with the cloud-based systems 70 that may provide for decentralized computing services and file storage. For example, portions (or all) of the systems 30, 32, 34, 36, 38 may be stored in the cloud 70 and/or accessible via the cloud 70.

The extensibility and customization systems 42, 44, 46, 48, 50, and 52 may provide for functionality not found natively in the CAR system 30, the CAD system 32, the CAM/CIM system 36, the CMM system 38 and/or the PDM system 40. For example, computer code or instructions may be added to the systems 30, 32, 34, 36, and/or 38 via shared libraries, modules, software subsystems and the like, included in the extensibility and customization systems 42, 44, 46, 48, 50, and/or 52. The extensibility and customization systems 42, 44, 46, 48, 50, and 52 may also use application programming interfaces (APIs) included in their respective systems 30, 32, 34, 36, and 38 to execute certain functions, objects, shared data, software systems, and so on, useful in extending the capabilities of the CAR system 30, the CAD system 32, the CAM/CIM system 36, the CMM system 38 and/or the PDM system 40. By enabling the processes 12, 14, 16, 18, 20, and 22, for example, via the systems 30, 32, 34, 36, and 38 and their respective extensibility and customization systems 42, 44, 46, 48, 50, and 52, the techniques described herein may provide for a more efficient "cradle-to-grave" product lifecycle management.

Figure 3:
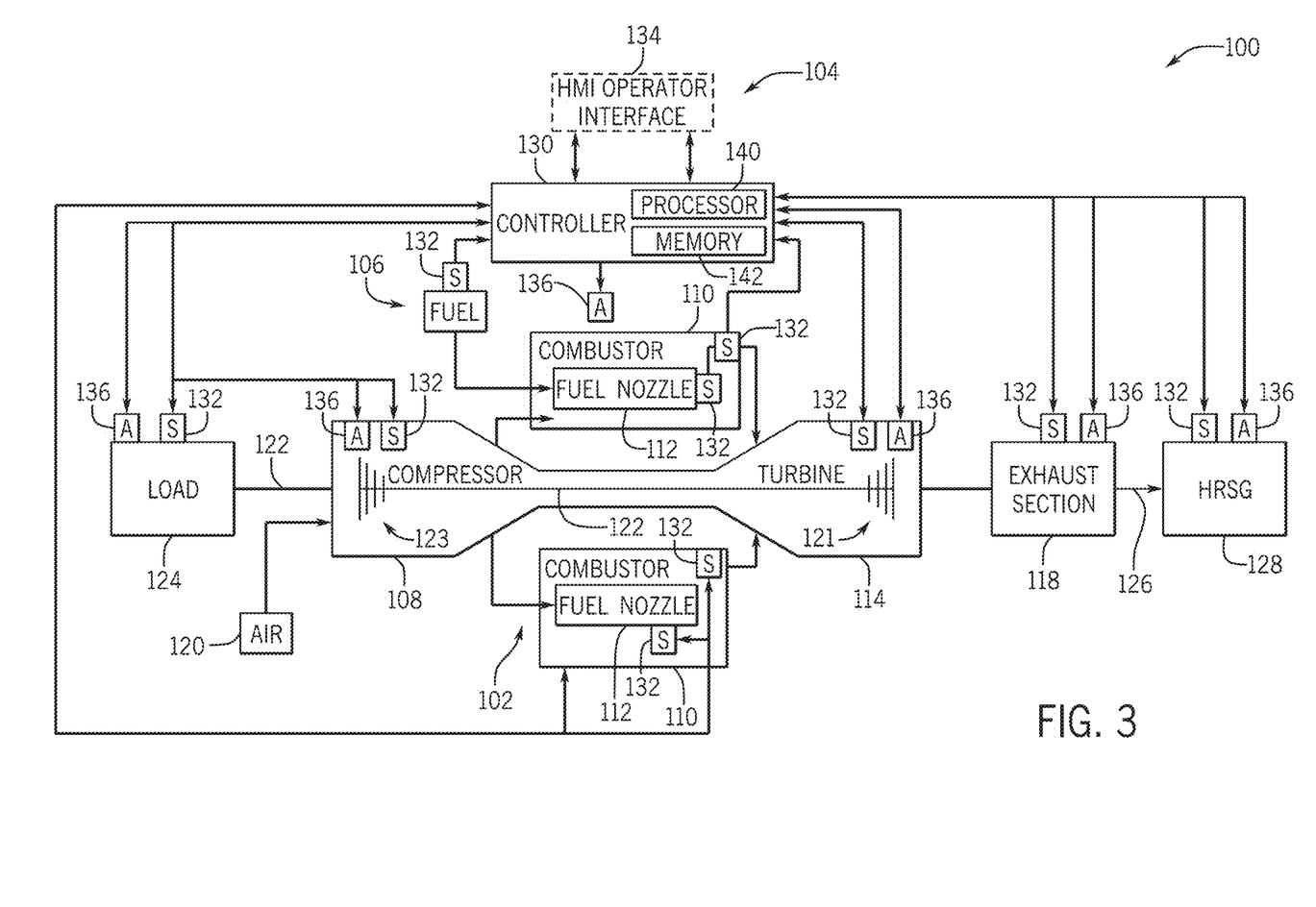
FIG. 3 is a block diagram of an industrial system that may be conceived, designed, engineered, manufactured, and/or service and tracked by the CAx system of FIG. 1, in accordance with embodiments described herein.

It may be beneficial to describe a machine that would incorporate one or more parts manufactured and tracked by the processes 12, 14, 16, 18, 20, and 22, for example, via the CAx system 10. Accordingly, FIG. 3 illustrates an example of a power production system 100 that may be entirely (or partially) conceived, designed, engineered, manufactured, serviced, and tracked by the CAx system 10. As illustrated in FIG. 1, the power production system 100 includes a gas turbine system 102, a monitoring and control system 104, and a fuel supply system 106. The gas turbine system 102 may include a compressor 108, combustion systems 110, fuel nozzles 112, a gas turbine 114, and an exhaust section 118. During operation, the gas turbine system 102 may pull air 120 into the compressor 108, which may then compress the air 120 (e.g., via a series of compressor stages 123) and move the air 120 to the combustion system 110 (e.g., which may include a number of combustors). In the combustion system 110, the fuel nozzle 112 (or a number of fuel nozzles 112) may inject fuel that mixes with the compressed air 120 to create, for example, an air-fuel mixture.

The air-fuel mixture may combust in the combustion system 110 to generate hot combustion gases, which flow downstream into the turbine 114 to drive one or more turbine stages. For example, the combustion gases may move through the turbine 114 to drive one or more stages of turbine blades 121, which may in turn drive rotation of a shaft 122. The shaft 122 may connect to a load 124, such as a generator that uses the torque of the shaft 122 to produce electricity. After passing through the turbine 114, the hot combustion gases may vent as exhaust gases 126 into the environment by way of the exhaust section 118. The exhaust gas 126 may include gases such as carbon dioxide ($CO_2$), carbon monoxide (CO), nitrogen oxides ($NO_x$), and so forth.

The exhaust gas 126 may include thermal energy, and the thermal energy may be recovered by a heat recovery steam generation (HRSG) system 128. In combined cycle systems, such as the power production system 100, hot exhaust 126 may flow from the gas turbine 114 and pass to the HRSG 128, where it may be used to generate high-pressure, high-temperature steam. The steam produced by the HRSG 128 may then be passed through a steam turbine engine for further power generation. In addition, the produced steam may also be supplied to any other processes where steam may be used, such as to a gasifier used to combust the fuel to produce the untreated syngas. The gas turbine engine generation cycle is often referred to as the "topping cycle," whereas the steam turbine engine generation cycle is often referred to as the "bottoming cycle." Combining these two cycles may lead to greater efficiencies in both cycles. In particular, exhaust heat from the topping cycle may be captured and used to generate steam for use in the bottoming cycle.

In certain embodiments, the power production system 100 may also include a controller 130. The controller 130 may be communicatively coupled to a number of sensors 132, a human machine interface (HMI) operator interface 134, and one or more actuators 136 suitable for controlling components of the power production system 100. The actuators 136 may include valves, switches, positioners, pumps, and the like, suitable for controlling the various components of the system 100. The controller 130 may receive data from the sensors 132, and may be used to control the compressor 108, the combustion system 110, the turbine 114, the exhaust section 118, the load 124, the HRSG 128, and so forth.

In certain embodiments, the HMI operator interface 134 may be executable by one or more computer systems of the power production system 100. A plant operator may interface with the power production system 100 via the HMI operator interface 134. Accordingly, the HMI operator interface 134 may include various input and output devices (e.g., mouse, keyboard, monitor, touch screen, or other suitable input and/or output device) such that the plant operator may provide commands (e.g., control and/or operational commands) to the controller 130.

The controller 130 may include a processor(s) 140 (e.g., a microprocessor(s)) that may execute software programs to perform the disclosed techniques. Moreover, the processor 140 may include multiple microprocessors, one or more "general-purpose" microprocessors, one or more special-purpose microprocessors, and/or one or more application specific integrated circuits (ASICS), or some combination thereof. For example, the processor 39 may include one or more reduced instruction set (RISC) processors. The controller 130 may include a memory device 142 that may store information such as control software, look up tables, configuration data, etc. The memory device 142 may include a tangible, non-transitory, machine-readable medium, such as a volatile memory (e.g., a random access memory (RAM)) and/or a nonvolatile memory (e.g., a read-only memory (ROM), flash memory, a hard drive, or any other suitable optical, magnetic, or solid-state storage medium, or a combination thereof).

Figure 4:
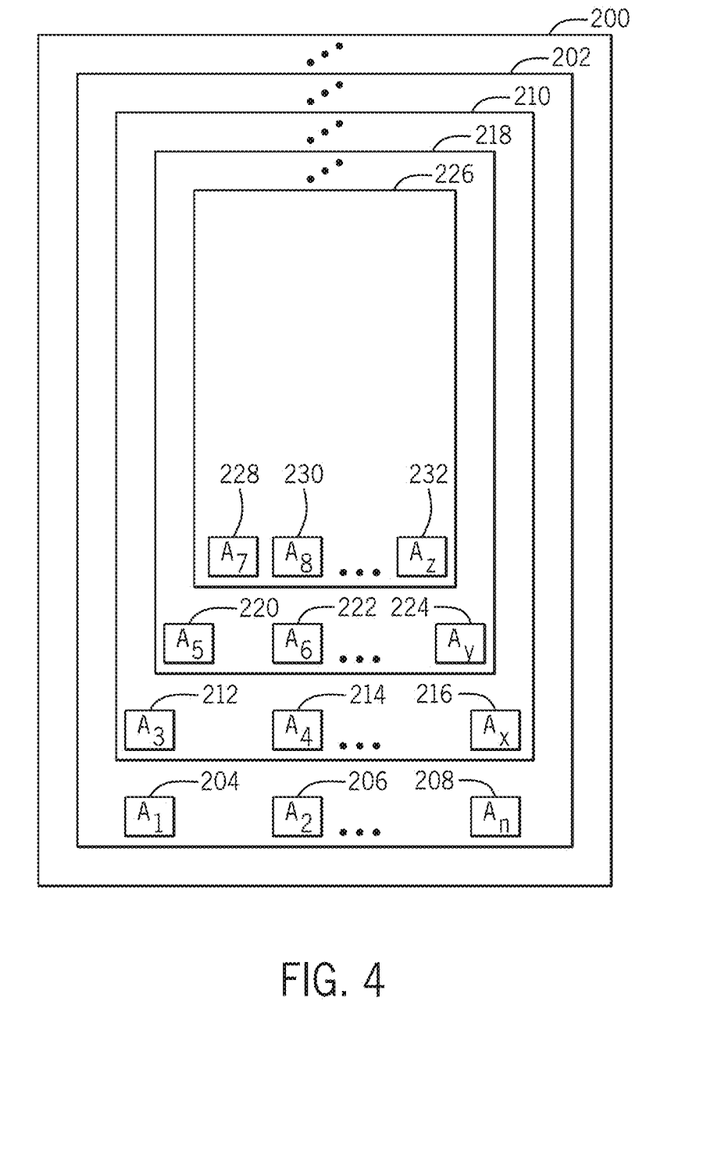
FIG. 4 is a block diagram of a file and its relationship with other items, such that the file includes data regarding a computer-aided design model, in accordance with embodiments described herein.

Components of the power production system 100 may be designed and/or modeled using the CAD system 32 as part of the design processes 14. During the design processes 14 or other PLM processes such as, but not limited to, the development/engineering processes 16 and the manufacturing processes 18, users may edit the design of the CAD model and/or utilize a BOM associated with the CAD model. With this in mind, FIG. 4 is a block diagram representative of a file 200 and its relationship with other items, such that the file 200 includes data regarding a CAD model. The file 200 may be generated by and/or utilized by the processors 24 executing the CAD checking application 45. The file 200 may also include a model of a component of the power production system 100. Programming objects and attributes stored in the file 200 may be presentative of the parts and/or aspects of the model. FIG. 4 illustrates how the programming objects and/or attributes representative of portions of the model may be related to each other. For example, a programming object 226 may include attributes 228, 230, 232, and another programming object (e.g., programming object 218) may include the programming object 226 and attributed 220, 222, 224. These programming objects may be representative of various portions of the mode. For instance, the programming object 226 may be representative of a part in the model that is part of the component represented by the 218.

As shown in FIG. 4, the file 200 may include programming objects 202, 210, 218, 226. The programming objects 202, 210, 218, 226 may be associated with the model. For example, the programming objects 202, 210, 218, 226 may pertain to components of the model or even components of model components. The programming objects 202, 210, 218, 226 may also be associated with various features of the model or a collection of components of the model. For instance, one of the programming objects 202, 210, 218, 226 may pertain to a part of the model, while another one of the programming objects 202, 210, 218, 226 may pertain to a component of the part.

By way of example, the programming objects 202, 210, 218, 226 are arranged in a hierarchical manner (e.g., first, second, third, and fourth hierarchical levels of programming objects). In other words, some of the programming objects 202, 210, 218, 226 may include one or more other programming objects 202, 210, 218, 226. For instance, the programming object 210 includes the programming objects 218, 226. It should be noted that the file 200 may include any suitable number of programming objects or hierarchical levels of programming objects. For example, while FIG. 4 illustrates the file 200 as including the programming objects 202, 210, 218, 226 arranged in four hierarchical levels, there may be more than one programming object at each hierarchical level, and there may be more or less than four hierarchical levels of programming objects. For instance, the programming object 218 may include the programming object 226 and one or more other programming objects, and the file 200 may include six hierarchical levels of programming objects.

The programming objects 202, 210, 218, 226 may also include attributes. More specifically, the programming object 202 may include attributes 204, 206, 208; the programming object 210 may include attributes 212, 214, 216; the programming object 218 may include attributes 220, 222, 224; and the programming object 226 may include attributes 228, 230, 232. It should be noted that the programming objects 202, 210, 218, 226 may include any suitable number of attributes. Each of the attributes 204, 206, 208, 212, 214, 216, 220, 222, 224, 228, 230, 232 may include data related to the programming object with which each of the attributes 204, 206, 208, 212, 214, 216, 220, 222, 224, 228, 230, 232 is associated and/or with the part or component with which the programming objects 202, 210, 218, 226 are associated. For instance, the attributes 204, 206, 208, 212, 214, 216, 220, 222, 224, 228, 230, 232 may include data regarding, among other things, measurements or dimensions of a part or component, names of parts, components, or programming objects, an identifier associated with a part (e.g., a callout number or a part number), component, or programming object, tolerances associated with a part or component, a font and/or font size associated with a programming object. Additionally, the programming objects 202, 210, 218, 226 may include programming objects that are also included in other programming objects.

Figure 5:
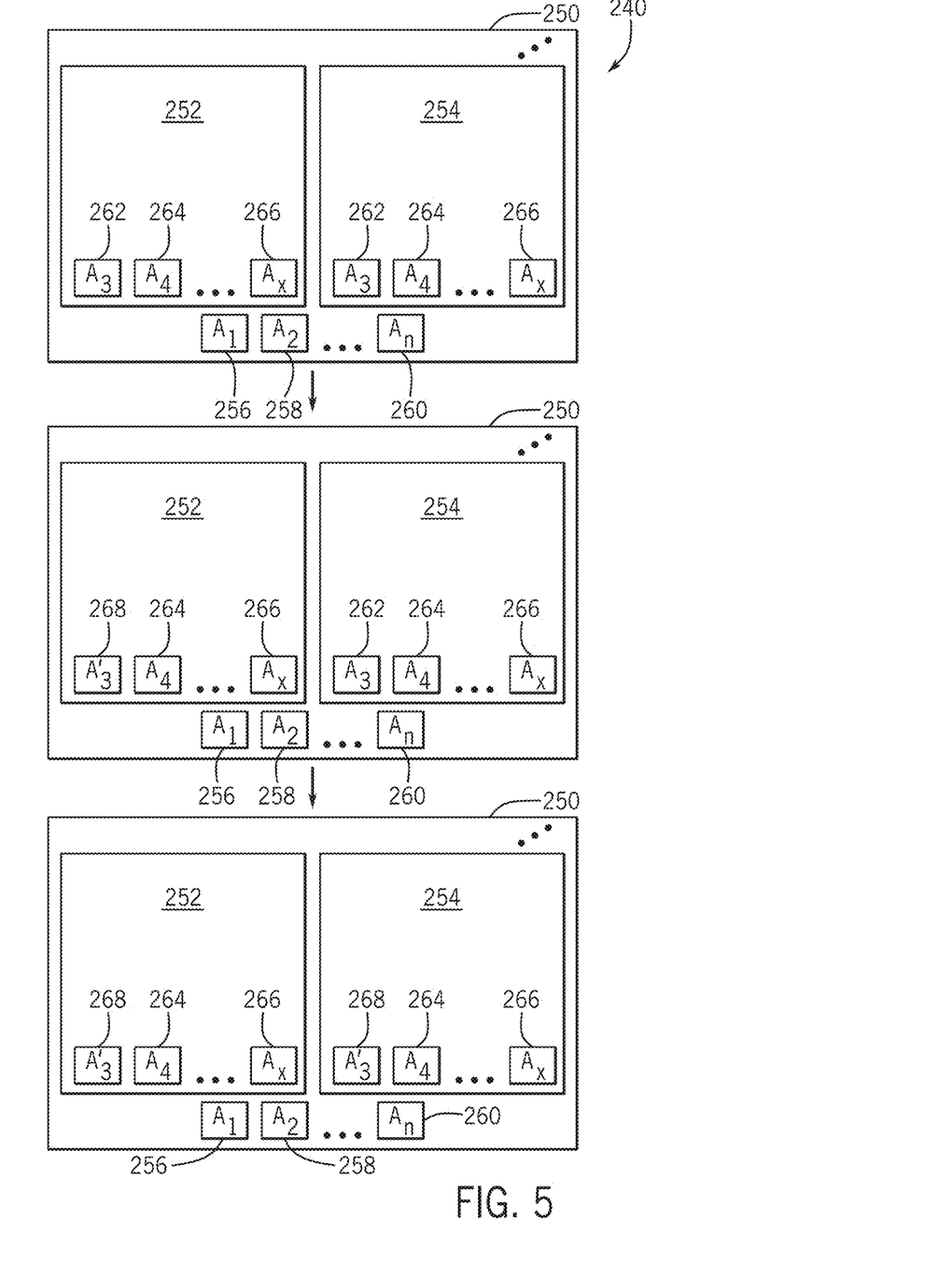
FIG. 5 is a block diagram of a process for modifying an attribute of a file in a similar manner as a previous modification to another attribute of the file, in accordance with embodiments described herein.

Keeping the discussion of FIG. 4 in mind, FIG. 5 is a block diagram of a process 240 for modifying an attribute of a file in a similar manner as a previous modification to another attribute of the file. For example, as discussed below, a user may cause a modification to be made to an attribute, and the user, via execution of the attribute managing application 45, may apply the same modification to other attributes based on a selected hierarchical level of programming objects selected by the user. However, it should be noted that the process 240 may be performed without a selection of a hierarchical level. Additionally, the process 240 may be used to modify programming objects, not just attributes. That is, the process 240 may be used to apply a change made to one programming object to other programming objects associated with the one programming object.

A programming object 250 includes programming objects 252, 254 as well as attributes 256, 258, 260. As illustrated, the programming object 250 may include more programming objects and attributes. The programming objects 252, 254 may each include attributes 262, 264, 266. That is, the programming objects 252, 254 include the several of the same attributes (e.g., duplicates or more than one instance of the attributes). Furthermore, it may be the case that the programming objects 252, 254 correspond to duplicate parts of a component in a model. For instance, the programming objects 252, 254 may correspond to screws used in a component of the power production system 100. However, it should be noted that the programming objects 252, 254 may also correspond to different parts and may include other attributes in addition to the attributes 262, 264, 266. Additionally, while FIG. 5 illustrates two hierarchical levels of programming objects, it is to be appreciated that the programming objects 250, 252, 254 may be included in a file that includes other programming objects and/or hierarchical levels of programming objects.

In some embodiments, a user may edit a model associated with the programming objects 250, 252, 254. In light of the edit, the programming object 252 may include modified attribute 268, which is a modified version of the attribute 262. For example, using a program to edit a model, the user may have changed a dimension of a screw in the model, the programming object 252 may pertain to the screw, and the attribute 262 may pertain to a value of the dimension before the user edited the screw. By modifying the dimension of the screw, the modified attribute 268 corresponds to the dimension of the screw after the user modification.

Utilizing a feature of the attribute managing application 45, the user may apply the same modification that resulted in modified attribute 268 to be generated to other attributes of other programming objects. For instance, the user may use the attribute managing application 45 to effect the same modification to the attribute 262 of the programming object 254, causing both programming objects 252, 254 to include the modified attribute 268. As discussed in greater detail in relation to FIG. 6, the user may select a hierarchical level of programming objects to which the user wants to apply a modification. That is, the user may select a hierarchical level, and any programming object within the selected hierarchical level that includes the attribute that was modified (e.g., modified attribute 268) may be modified to be similar to, or the same as, the modified attribute. In other words, a user may apply a modification made to one attribute to any other iteration of the same attribute that is in a hierarchical level selected by the user. However, as noted above and discussed in greater detail below, the process 240 may be used to apply a modification without receiving a selection of a hierarchical level.

While the discussion of FIG. 5 relates to a modification to the attribute 262, it should be noted that the process 240 may apply to an addition or deletion of an attribute. For example, a user may add an attribute to a programming object, and the user may use the attribute managing application 45 to add the attribute to other programming objects (e.g., programming objects of a user-selected hierarchical level). For instance, the added attribute may pertain to a tolerance associated with a part in the model, and the user may wish to add the same tolerance to each of the other parts that are the same in the model. In this example, the attribute managing application 45 allows the user to automatically change the tolerances of each of the other same parts in the model based on a selected hierarchical level of programming objects.

Figure 6:
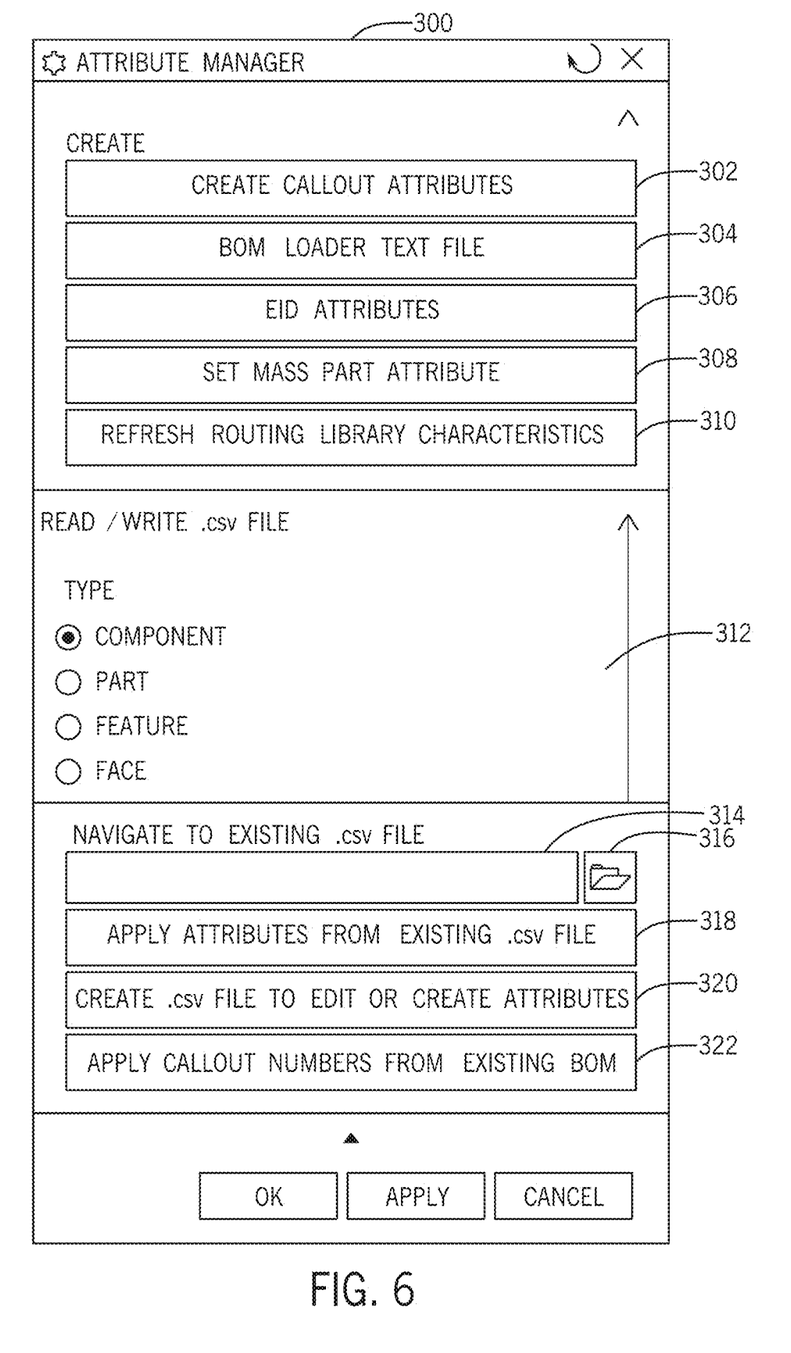
FIG. 6 is a diagram of an attribute managing application tool, in accordance with embodiments described herein.

Continuing with the drawings, FIG. 6 is a diagram of an attribute managing application tool 300. Execution of the attribute managing application 45 by the processors 24 may allow for a user to access and utilize the attribute managing application tool 45. As discussed below, the attribute managing application tool 300, via execution of the attribute managing application 45, may allow a user to perform various tasks related to models and attributes associated with models. Additionally, the attribute managing application tool 300 may be utilized to perform the process 240.

The attribute managing application tool 300 includes several tools that may be used to create and/or identify attributes and/or identifiers (e.g., callout numbers) associated with a model. For example, a callout attribute creation tool 302 allows for a user to assign callout numbers to every component and/or feature of a model. That is, the callout attribute creation tool 302 allows for a user to assign a callout number, which may be an attribute or tag, to each programming object and/or each attribute of each programming object in a model. In other words, a callout number may define a programming object and/or an attribute associated with a model. In some embodiments, the callout numbers may be automatically assigned in a specific manner. For instance, callout numbers may be assigned to attributes of programming objects of one hierarchical level first, and attributes of programming objects of another hierarchical level may subsequently be assigned a callout number. Additionally, when utilized, the callout attribute creation tool 302 allows for a user to select whether to keep existing callout numbers or generate new callout numbers. For example, the user may have utilized the callout attribute creation tool 302 a first time, and the user may utilize the callout attribute creation tool 302 a second time in order to modify the generated callout numbers.

Figure 7:
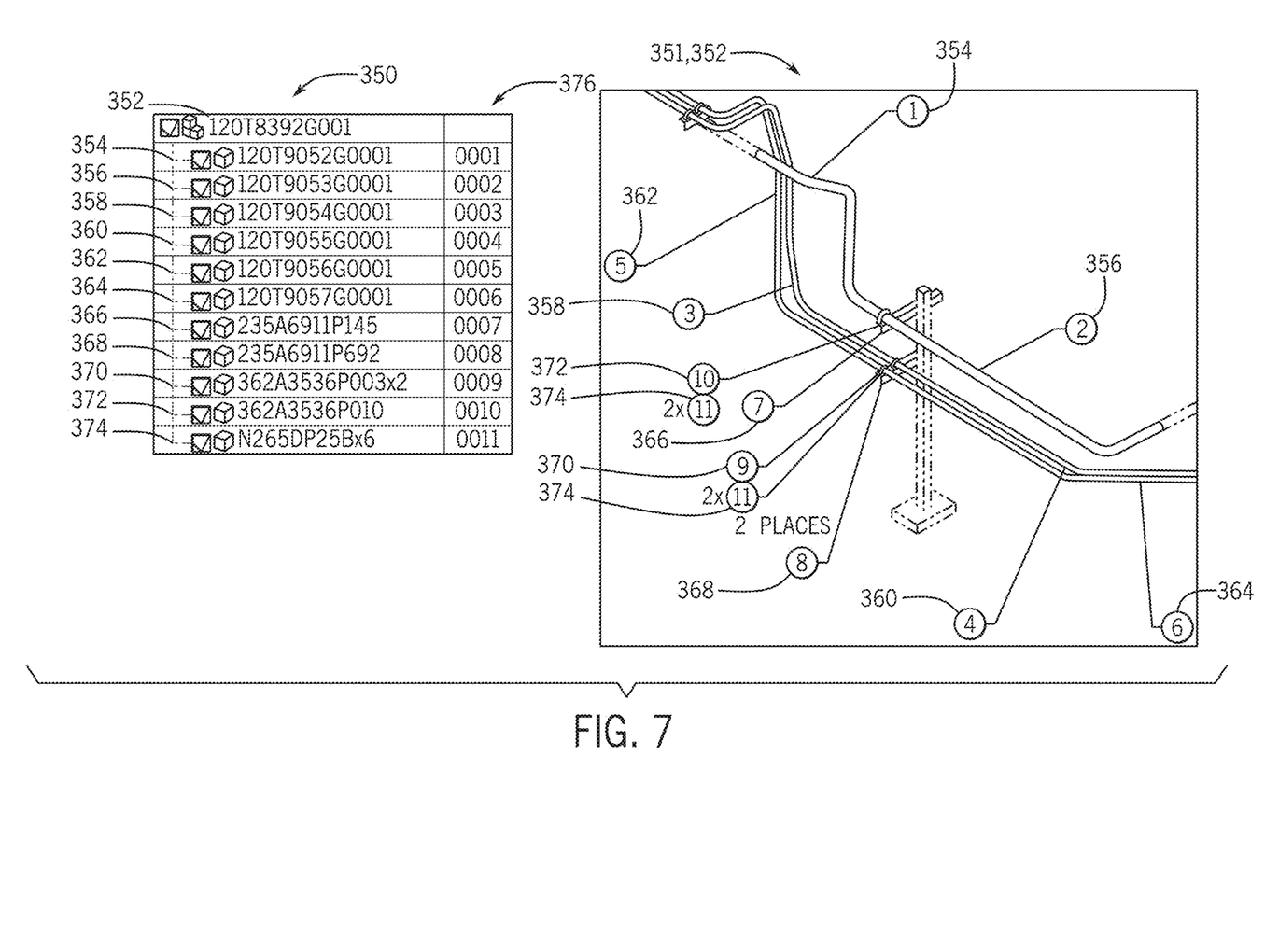
FIG. 7 is a callout list associated with a model of a pipe assembly, in accordance with embodiments described herein.

With the discussion of the callout attribute creation tool 302 in mind, FIG. 7, illustrates a callout list 350 associated with a model 351 of a pipe assembly that may be included in the power production system 100. As discussed above in relation to FIG. 6, the callout numbers may be generated as a result of a user utilizing the callout attribute creation tool 302. The callout list 350 may be representative of each of the programming objects in a model as well as the callout numbers associated with the programming objects. For instance, the callout numbers may be attributes of the programming objects, and the callout list 350 may reflect such as association. As illustrated, the callout list 350 includes a list of programming objects of two hierarchical levels of programming objects associated with the model 351. More specifically, the model 351 may detail a programming object 352 of one hierarchical level, and the programming object 352 may include programming objects 354, 356, 358, 360, 362, 364, 366, 368, 370, 372, 374 of another hierarchical level of programming objects. Additionally, each of the programming objects 354, 356, 358, 360, 362, 364, 366, 368, 370, 372, 374 may correspond to a component of the model 351 of the pipe assembly. Furthermore, the callout list 350 may also include a number of instances of a programming object in the model 351. For example, the "×2" indicates that the programming object 370 is included in the model twice, and the "×6" indicates that the programming object 374 is included in the model six times.

The callout list 350 may also include a callout number list 376 that enumerates callout numbers associated with each of the programming objects 354, 356, 358, 360, 362, 364, 366, 368, 370, 372, 374. For instance, a callout number of "0001" is associated with the programming object 354, while a callout number of "0005" is associated with the programming object 362. Moreover, the model 351 may indicate the programming objects 354, 356, 358, 360, 362, 364, 366, 368, 370, 372, 374 based on the callout numbers associated with the programming objects 354, 356, 358, 360, 362, 364, 366, 368, 370, 372, 374. More specifically, a callout number (e.g., "0007"), or an abbreviated form of a callout number (e.g., "7") may be displayed in the model 351 to indicate where a programming object associated with the callout numbers is located in the model 351.

Referring back to FIG. 6, the attribute managing application tool 300 may also include a BOM creation tool 304. A user may utilize the BOM creation tool 304 to generate a file that includes a BOM of the parts and components found in a model (e.g., the model 351). The file may be a text (.txt) file or any other file type that may be used to store data representative of alphanumeric characters. A generated BOM may include parts and components, callout numbers associated with the parts and components, and a quantity of each of the parts and components. The BOM may be utilized in the manufacturing processes 18 to manufacture the parts, component, and/or a part that includes the parts and/or components. For instance, a BOM including each of the components associated with the programming objects 354, 356, 358, 360, 362, 364, 366, 368, 370, 372, 374 may be used to manufacture the pipe assembly associated with the programming object 352.

The attribute managing application tool 300 may also include an enterprise identifier (EID) tool 306 that a user may utilize to apply EID attributes to a model. EID attributes may provide another manner in which attributes and programming objects may be classified. For example, the memory 26 or the network 70 may include data related to other PLM processes or PLM data, and the user may want to use such data to identify the parts and components of a model instead of using the callout attribute creation tool 302. Utilization of the EID tool 306 may allow for a user to select to use identifiers already being used (e.g., identifiers associated with another model) instead of generating new callout attributes.

The attribute managing application tool 300 may also include mass part attribute tool 308 that may be used to apply one or more attributes and/or a callout number associated with a programming object to other programming objects. In other words, a user may utilize the mass part attribute tool 308 to carry out the process 240 discussed above in relation to FIG. 5.

For example, a user, may edit a part of a model (i.e., cause a change to be made to a programming object (e.g., a change to an attribute of a programming object)). Using the mass part attribute tool 308, the user may apply the edit to other parts or components of the model. In other words, the user may make the same change(s) to attributes of other programming objects. Upon selecting the mass part attribute tool 308 (e.g., via a mouse click), the user may be prompted to select the components or parts to which the user would like the same edit to be applied. For instance, referring briefly back to the model 351 of the pipe assembly of FIG. 7, the user may have edited one instance of the programming object 374. Instead of making the same edit to each of the five other instances of the programming object 374, the user may utilize the mass part attribute tool 308, select to apply the edit to each instance of the programming object 374, and the edit may be applied to the five other instances of the programming object 374. As discussed above, it should also be noted that the mass part attribute tool 308 may be used to add or delete attributes from programming objects.

Furthermore, a user may add or delete programming objects from a hierarchical level of programming objects that are included within another hierarchical level. For instance, a user may delete the programming object 364 from what is included in the programming object 352. The user may use the mass part attribute tool to apply this deletion to other programming objects. For example, there may be another programming object that was identical to the programming object 352 before the programming object 364 was deleted. The user may select such programming object, and that programming object will be modified in a manner that deletes a programming object that is equivalent to the programming object 364 (e.g., another instance of the programming object 364).

Referring back to FIG. 6, the attribute managing application tool 300 may include a library mapping tool 310. Before discussing the functionality of the library mapping tool 310, it should be noted that various libraries of programming objects and attributes may be stored (e.g., on the memory 26 or the network 70), and accessed by the processors 24 that execute the attribute managing application 45. More specifically, a library may include data specific to various parts or components of a model or a project (i.e., a collection of models) of which the model is a part. The parts and components of a model may be added to the library, and a library identifier may be assigned to the parts and components. For example, a user may model a part of a pipe assembly (e.g., a pipe), store the part in the library, and an identifier may be assigned to the part. More specifically, in this example, the library may include programming objects and attributes associated with pipe, and the programming objects and/or attributes may also be associated with identifiers. Moreover, a user may access the library and modify parts or components directly from the library.

With this in mind, the library mapping tool 310 allows a user to modify programming objects and attributes of a model (e.g., the model 351) based on the programming objects and attributes stored in a library. Upon selecting the library mapping tool 310, the processors 24 may cycle through each of the parts and components in a model and determine whether the parts and components are included in a library. For example, the processors 24 may determine whether the parts of a model have an identifier, and if a part does have an identifier, the processors 24 may determine whether the identifier is associated with a part in the library. More specifically, the processors 24 may determine whether a part of a model is included in a library by determining if programming objects and/or attributes of programming objects of the model are in the library by comparing identifiers associated with the programming objects and attributes with identifiers of programming objects and attributes found in the library.

In the event a model includes parts or components that are also in a library, the parts and components of the model may be updated to be the same as those in the library. For instance, if a user edits or modifies a part that is stored in a library, the user may utilize the library mapping tool 310 on a model that includes parts used from the library to apply the modification to each instance of the part in the model. Even though a modification was made to the part in the library, the processors 24 may still determine that parts in the model were derived from the part in the library or were the same as the part in the library prior to the modification based on the identifiers associated with the parts. That is, as discussed above, the identifiers allow for the processors 24 to determine whether a part of a model was derived from a part in a library.

Furthermore, the attribute managing application tool 300 may allow a user to perform several editing functions of the attribute managing application 45. More specifically, a user may read (e.g., from the memory 26 or the network 70) and/or write a comma-separated values (CSV) file to be used in conjunction with the attribute managing application 45. The CSV file may store data associated with a model (e.g., model 351), the programming objects and attributes associated with the model, and data reflective of the review and/or editing done by the user in plain text. For instance, the CSV file may include a list of each of the programming objects associated with a model and data specific to each of the programming objects.

For example, a CSV file may be read into the attribute managing application 45, which may allow a user to modify programming objects and/or attributes of a model based on the data stored in the CSV file. More specifically, a user may modify programming objects and attributes of programming objects based on the programming objects and attributes stored in a CSV file as well as a user-selected hierarchical level of programming objects to be modified. For instance, a user may use the programming object type tool 312 to select a hierarchical level of programming objects to be modified based on a CSV file. In the illustrated embodiment, the programming object type tool 312 allows for a user to select from four hierarchical levels of programming objects. However, in other embodiments, the programming object type tool 312 may allow for a user to select from less than four (e.g., two or three) or more than four (five or greater) hierarchical levels of programming objects. Additionally, as illustrated, the hierarchical levels of programming objects are listed in a descending order or specificity. That is, a hierarchical level may include each of the hierarchical levels that are listed above the hierarchical level. It should be noted that programming objects and attributes may automatically be assigned to a hierarchical level (e.g., based on the part or component of the model with which the programming objects and attributes are associated) and/or a user may select a hierarchical level with which the programming objects and attributes are associated.

A user may enter the name of the CSV file the user wishes to use into a file name box 314. Alternatively, a user may select a CSV file loading tool 316, which may open a directory of files from which the user may select a CSV file to use.

After a user has selected a hierarchical level of programming objects in the programming object type tool 312 and a CSV file by utilizing the file name box 314 or the CSV file loading tool 316, the user may use an attribute applying tool 318 to create attributes in a model or apply attributes to a model based on the programming objects and attributes associated with the user-selected CSV file. More specifically, the processors 24 may determine whether a programming object in a model corresponds to data of a programming object stored in the CSV file (e.g., via a programming object identifier, a name of a programming object, a callout number, or another identifier). If the processors determine this in the affirmative, the processors 24 may determine whether the programming object of the model includes the same programming objects and/or attributes as the corresponding programming object and of the CSV file. For example, utilization of the attribute applying tool 318 may cause the programming object of the model to be edited to include or delete programming objects and/or attributes, and programming attributes and/or attributes associated with the model may be modified to match the programming objects and attributes saved in the CSV file.

Additionally, a user may create a CSV file that includes each of the existing attributes associated with a user-selected hierarchical level of programming objects using a CSV file creation tool 320. The user may type a name of a CSV file to be created into the file name box 314 and/or type a name of a CSV file to be created in a folder navigated to using the CSV file loading tool 316. In other words, a user may use the CSV file loading tool 316 to select a storage location for a CSV file to be created and name a name for the CSV file to be created. For example, a user may create a model (e.g., the model 351), use the callout attribute creation tool 302 to generate callout numbers for programming objects and/or attributes associated with the model. The user may then select a hierarchical level of programming objects for which a CSV file to be created will include data. That is, the user may select, by hierarchical level, which programming objects and attributes associated with the model will be saved in the CSV file.

Furthermore, the attribute managing application tool 300 includes a BOM attribute applying tool 322, which a user may utilize to apply callout numbers associated with a BOM to a model. More specifically, the BOM attribute applying tool 322 may allow for a user to apply callout numbers associated with a BOM (e.g., a BOM saved on the memory 26 or the network 70) based on a user-selected hierarchical level. For example, referring back to the callout list 350 and the model 351 of FIG. 7, a user may want to apply the callout numbers of the callout number list 376 to a different model of the pipe assembly of model 351. The programming object 352, which may be the programming object with which the pipe assembly is associated, may correspond to the "part" hierarchical level of the hierarchical levels listed in the programming object type tool 312. A user may select "part" in the programming object type tool 312, utilize the file name box 314 or the CSV file loading tool 316 to select a file that includes a BOM of the model 351. The user may then utilize the BOM attribute applying tool 322, which may cause the processors 24 to determine which programming objects and attributes of the model correspond to the programming objects and attributes of the file that are included in the programming object 352 and apply the callout numbers from the list 376 to the programming objects and attributes of the model that correspond to the programming objects and attributes of the file for which a callout number exists.

Figure 8:
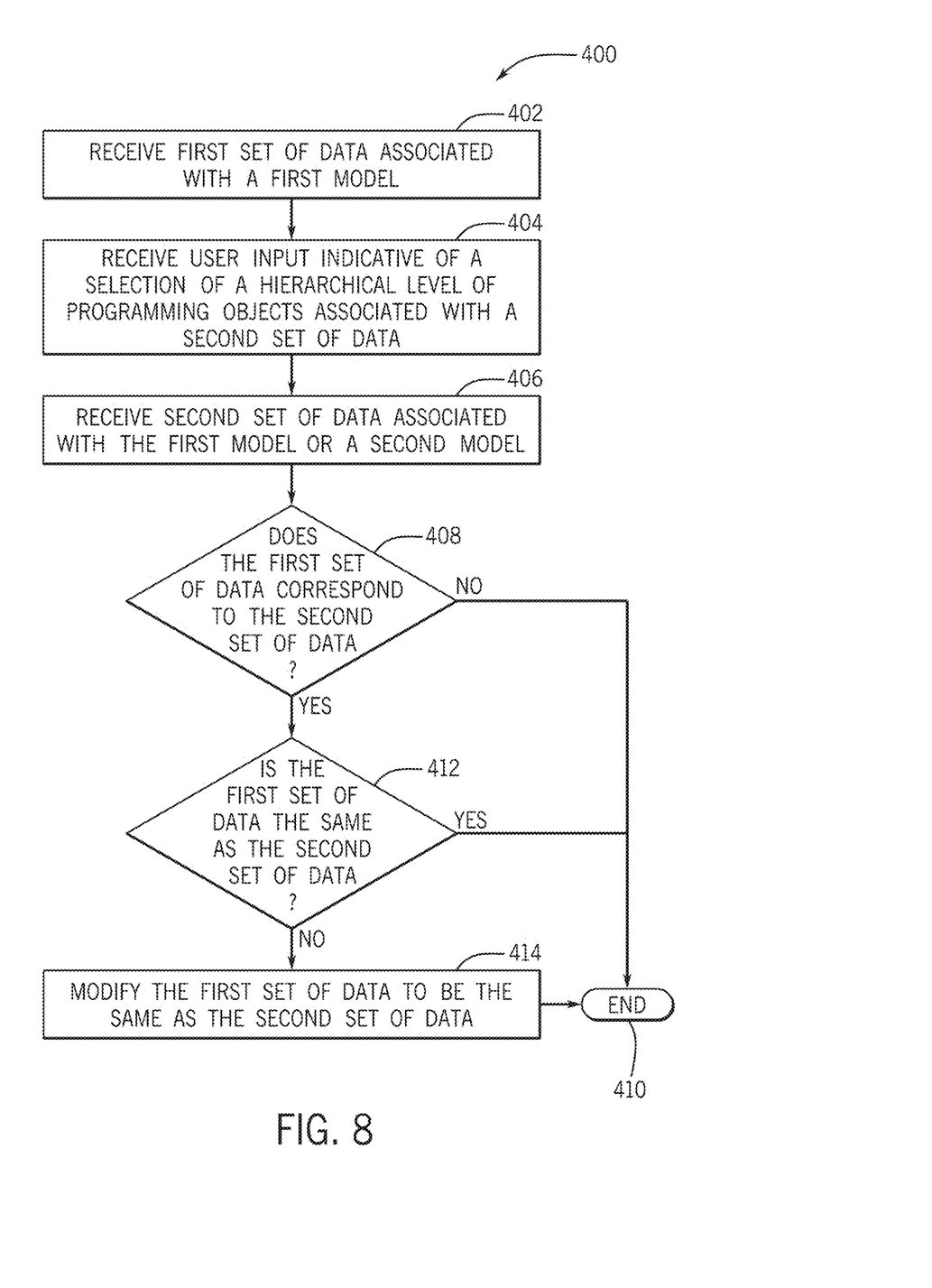
FIG. 8 is a flow chart of a method for applying a modification made to a programming object to other programming objects, in accordance with embodiments described herein.

With the discussion of the attribute managing application 45 and the attribute managing application tool 300 in mind, FIG. 8 is a flow chart of a method 400 for applying a modification made to a programming object to other programming objects. The method 400 may be performed by processors executing the attribute managing application 45 (e.g., processors 24). Any suitable processor or application may perform the method 400. Additionally, the method 400 may be performed in any suitable order.

At block 402, the processors 24 may receive a first set of data associated with a first model. For example, the first model may be a model that a user is generating. As with the discussion above, the data associated with the first model may include programming objects, and the programming objects may have attributes. Furthermore, the programming objects may be associated with hierarchical levels of programming objects.

At block 404, the processors 24 may receive user input indicative of a selection of a hierarchical level of programming objects. For example, as discussed above in relation to FIG. 7, a user may make an input by utilizing the programming object type tool 312, and that input may indicate the user's selection of a hierarchical level.

At block 406, the processors 24 may receive a second set of data, which may be associated with the first model as the first set of data or another model (e.g., a second model). A user may make an input that causes the processors to receive the data associated with the second model. For instance, a user may name or select a file that includes data associated in the manner discussed above. Furthermore, while the term "second model" is used in the present discussion, it should be noted the second model may be a model that is similar to, or closely associated with, the first model. For example, the second model may be a modified version of the first file.

At block 408, the processors 24 may determine whether the first set of data corresponds to the second set of data. More specifically, the processors 24 may determine whether programming objects and attributes of the first set of data correspond to programming objects and attributes of the second set of data. As discussed above, the processors 24 may make such a determination by utilizing other data associated with the first model and the second file. For instance, the processors 24 may determine that the programming objects and/or attributes associated with the first and second sets of data are associated with identifiers and compare the identifiers. Continuing with this example, the may processors 24 determine that an identifier of a programming object and/or attribute of the first set of data is the same as an identifier associated with a programming object and/or attribute of the second set of data. That is, at block 408, the processors 24 may also determine to which programming object or attribute of the second model a programming object or attribute of the first model corresponds. Similarly, callout numbers and/or names of programming object and/or attributes may also be used in conjunction with or in the alternative to identifiers. If the processors determine that the data associated with the first set of data does not correspond to any of the data of the second set of data, the processors 24, at block 410, may terminate the method 400.

However, in the event the processors 24 determine that the data of the first set of data corresponds to the second set of data, at block 412, the processors 24 may determine whether the first set of data is the same as the second set of data. For instance, at block 410, the processors 24 may have determined that a programming object associated with the first model (i.e., a programming object of the first set of data) corresponds to a programming object associated with the second model (i.e., a programming object of the second set of data). At block 412, the processors 24 may determine whether the programming object of the first set of data and/or the attributes associated with the programming object of the first set of data are the same as the programming object of the second set of data and/or the attributes associated with programming object of the second set of data. For example, the programming object associated with the second set of data could correspond to a more recently modified version of a part of a model, and the programming object associated with the first set of data could correspond to an earlier version of the part. As another example, the programming object of the second set of data and the programming object of the first set of data may both correspond to the most recent version of a part in a model. In such a case, the programming object of the first set of data (as well as the attributes associated with the programming object of the first set of data) and the programming object of the second set of data (as well as the attributes associated with the programming object of the second set of data) are the same. If the processors 24 determine that each of the programming objects and/or attributes of the first set of data are the same as the programming objects and/or attributes of the second set of data to which the programming objects and/or attributes of the first model correspond, the processors 24, at block 410, may terminate the method 400.

However, if at block 412, the processors 24 determine that the first set of data is not the same as the second set of data, at block 414, the processors 24 may modify the first set of data in a manner such that the first set of data matches the second set of data. Continuing with the example from above in which a programming object of the second set of data could correspond to a more recently modified version of a part of a model and the programming object associated with the first set of data could correspond to an earlier version of the part, the processors 24 may modify the programming object of the first set of data so that the programming object of the first set of data is the same as the programming object of the second set of data. Such a modification, for example, may include replacing, adding, deleting, and/or modifying attributes of the programming object of the first set of data and/or attributes associated with the programming object of the first set of data.

When each of the programming objects and/or attributes have been modified, the processors 24, at block 410, may terminate the method 400. However, in another embodiment, the processors 24 may return to block 412 to determine that each of the programming objects and/or attributes of the first set of data are the same as the programming objects and/or attributes of the second set of data.

It is to be appreciated that the method 400 may be executed to carry out a wide variety of modifications to models. For instance, the method 400 may be used to apply a change made to one aspect of a model to each of other aspects of the model that are similar to the one aspect. In other words, the method 400 may be used to carry out the process 240. Additionally, the method 400 may be used perform the tasks associated with the attribute managing application tool 300. Furthermore, some of the steps of the method 400 (i.e., the blocks 402, 404, 406, 408, 410, 412, 414) may not be carried out in the execution of the method 400.

Additionally, while the discussion of the method 400 includes the terms "first set of data" and "second set of data," it should be noted that these terms are used for the purpose of explaining the method 400. The first set of data and the second set of data may be the same the set of data, the first set of data may be included within in the second set of data, and the second set of data may be included within the first set of data.

Technical effects of the present disclosure include systems and methods for allowing users to modify aspects of a model in a similar manner as another aspect of the model previously modified by the user. For instance, a user may make a change to one instance of a feature in a model, and using the teachings of the present disclosure, the user may apply the change to other instances of the feature in the model. Furthermore, a user may modify a model based on a selected hierarchical level of programming objects. By allowing for a single modification to be executed automatically to features of a model, components may be designed and revised more quickly.

This written description uses examples to of the presently disclosed embodiments, including the best mode, and also to enable any person skilled in the art to practice the disclosed embodiments, including making and using any devices or systems and performing any incorporated methods. The patentable scope of the disclosed embodiments is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). However, for any claims containing elements designated in any other manner, it is intended that such elements are not to be interpreted under 35 U.S.C. 112(f).

The invention claimed is:

1. A system, comprising a processor configured to:
   receive a modification to a programming object of a first set of data associated with a first set of properties of a computer-aided design (CAD) model;
   receive an input indicative of a first hierarchical level of a plurality of hierarchical levels of the CAD model;
   identify one or more programming objects of a second set of data associated with a second set of properties of the CAD model related to the first set of properties based on the first set of data and the input; and
   modify the one or more programming objects of the second set of data based on the modification to the programming object of the first set of data.

2. The system of claim 1, wherein the processor is configured to modify the second set of data by adding, deleting, or modifying the one or more programming objects of the second set of data.

3. The system of claim 1, wherein the first set of data comprises a first identifier associated with a portion of the CAD model, wherein the first identifier defines the programming object or an attribute of the programming object associated with the portion of the CAD model.

4. The system of claim 3, wherein the processor is configured to generate a bill of materials (BOM) associated with the CAD model based on receipt of a user input, wherein the BOM comprises a list representative of at least a portion of a plurality of identifiers associated with the CAD model, wherein the at least a portion of the plurality of identifiers comprises the first identifier.

5. The system of claim 3, wherein the processor is configured to modify the second set of data based on the modification to the first set of data by modifying the second set of data to become associated with at least a portion of a plurality of identifiers, wherein the at least a portion of the plurality of identifiers comprises the first identifier.

6. The system of claim 3, wherein the processor is configured to generate a plurality of identifiers associated with the CAD model based on receipt of a user input, wherein the plurality of identifiers comprises the first identifier, wherein each identifier of the plurality of the identifiers is associated with a different portion of the CAD model.

7. The system of claim 1, wherein:
   the first set of data comprises a library comprising data regarding a plurality of features of the CAD model, wherein the first set of data corresponds to a first feature of the plurality of features of the CAD model.

8. The system of claim 1, wherein the processor is configured to receive user input indicative of a first selection and a second selection, wherein:
   the first selection comprises a first portion of the CAD model, wherein the first portion of the CAD model is associated with the first set of data; and
   the second selection comprises a second portion of the CAD model, wherein the second portion of the CAD model is associated with the second set of data.

9. The system of claim 1, wherein the processor is configured to identify the second set of data by comparing a first set of identifiers associated with the first set of data to a second set of identifiers associated with the second set of data, wherein the first and second sets of identifiers define at least one programming object or attribute associated with the CAD model.

10. The system of claim 1, wherein the programming object of the first set of data comprises the one or more programming objects of the second set of data.

11. A tangible, non-transitory, machine-readable medium comprising instructions configured to cause a processor to:
    receive a modification to a programming object of a first set of data associated with a first set of properties of a computer-aided design (CAD) model;
    receive an input indicative of a first hierarchical level of a plurality of hierarchical levels of the CAD model;
    identify one or more programming objects of a second set of data associated with a second set of properties of the CAD model related to the first set of properties based on the first set of data and the input; and
    modify the one or more programming objects of the second set of data based on the modification to the programming object of the first set of data.

12. The tangible, non-transitory, machine-readable medium of claim 11, wherein the instructions are configured to cause the processor to identify the one of more programming objects of the second set of data by comparing a first identifier associated with the programming object of the first set of data to a second identifier associated with the second set of data, wherein the first identifier and the second identifier define programming objects or attributes associated with the CAD model.

13. The tangible, non-transitory, machine-readable medium of claim 11, wherein the first set of data is associated with a second hierarchical level of the plurality of hierarchical levels associated with the CAD model, and the second set of data is associated with the first hierarchical level of the plurality of hierarchical levels.

14. The tangible, non-transitory, machine-readable medium of claim 13, wherein the instructions are configured to cause the processor to:
receive a second input indicative of a selection of a file associated with the first set of data; and
modify the second set of data based on the input and the second input.

15. The tangible, non-transitory, machine-readable medium of claim 11, wherein the first set of data comprises a library comprising data regarding a plurality of features of the CAD model, wherein the first set of data corresponds to a first feature of the plurality of features of the CAD model.

16. A method, comprising:
receiving, via a processor, a modification to a programming object of a first set of data associated with a first set of properties of a first computer-aided design (CAD) model;
receive an input indicative of a first hierarchical level of a plurality of hierarchical levels of the CAD model;
identifying, via the processor, a first set of programming objects of a second set of data associated with a second set of properties of the first CAD model or a second set of programming objects of a third set of data associated with a third set of properties of a second CAD model based on the first set of data and the input, wherein the first set of properties is related to the second and third sets of properties; and
modifying, via the processor, the first set of programming objects of the second set of data, the second set of programming objects of the third set of data, or both based on the modification to the programming object of the first set of data.

17. The method of claim 16, wherein identifying the first set of programming objects of the second set of data or the second set of programming objects of the third set of data comprises comparing a first identifier associated with the programming object of the first set of data to a second identifier associated with the second set of data or the third set of data, wherein the first identifier and the second identifier define at least one programming object or attribute associated with the CAD model.

18. The method of claim 17, wherein the first identifier corresponds to a first callout number, wherein the first callout number corresponds to a portion of the first CAD model.

19. The method of claim 18, comprising:
generating a bill of materials (BOM) associated with the first CAD model, wherein the BOM comprises a list of a plurality of callout numbers, wherein the plurality of callout numbers comprises the first callout number and each callout number of the plurality of callout numbers corresponds to different portions of the first CAD model.

20. The method of claim 16, comprising receiving, via the processor, a second input, wherein the input is indicative of a first selection of a first portion of the first CAD model, wherein the second input is indicative of a second selection of a second portion of the first model or a portion of the second model.

* * * * *